United States Patent [19]

Miller

[11] Patent Number: 5,097,221
[45] Date of Patent: Mar. 17, 1992

[54] ADAPTIVE FILTER TECHNIQUE FOR SUPPRESSION OF WIDEBAND OR OFFSET NARROWBAND RADIO FREQUENCY INTERFERENCE

[75] Inventor: Jeffry J. Miller, Warminster, Pa.

[73] Assignee: The United States of America as represented by the Secretary of the Navy, Washington, D.C.

[21] Appl. No.: 631,582

[22] Filed: Dec. 21, 1990

[51] Int. Cl.$^5$ .............................................. H03D 3/00
[52] U.S. Cl. .................................... 329/318; 329/319; 455/266
[58] Field of Search .................. 329/318, 319; 358/36, 358/38, 167; 455/266, 296, 307

[56] References Cited
U.S. PATENT DOCUMENTS
4,641,181  2/1987  Mobley .............................. 329/319 X
4,698,598 10/1987  Mobley et al. ....................... 329/319

OTHER PUBLICATIONS
Macario et al., "Method of Reducing the F.M. Threshold Using a Tracking N-Path Filter", 06 Feb. 1970.

Primary Examiner—Robert J. Pascal
Attorney, Agent, or Firm—James V. Tura; James B. Bechtel; Susan E. Verona

[57] ABSTRACT

The adaptive filter for frequency modulation of the present invention utilizes an audio tone multiplexed into the baseband modulation spectrum as a pilot tone to control and determine the amount of adaptation of the effective and variable bandwidth of the filter for optimum selectivity and rejection of wideband interference or narrowband offset interference. The multiplexed tone is detected and the filter is adjusted according to the signal-to-noise ratio of the detected tone. A continuous and adaptive decrease or increase in bandwidth is produced to accommodate the actual signal bandwidth to achieve rejection of interference with minimum distortion. Additionally, the filter compensates for transmitter drift of center frequency. This filter may be used at radio or intermediate frequencies.

21 Claims, 3 Drawing Sheets

ADAPTIVE FILTER TECHNIQUE FOR SUPPRESSION OF WIDEBAND OR OFFSET NARROWBAND RADIO FREQUENCY INTERFERENCE

STATEMENT OF GOVERNMENT INTEREST

The invention described herein may be used by and for the Government of the United States Of America for Governmental purposes without the payment of any royalties thereon or therefore.

BACKGROUND OF THE INVENTION

This invention relates to a filter and in particular to a filter having adjustable poles wherein the poles are adjusted to suppress interference and improve signal-to-noise ratio.

It is known in the art to provide continuously adaptive filters for radio frequency (RF) applications. It is also known in the art to provide adaptive filters for telephony and image processing. For example, L type adaptive filters and Volterre adaptive filters are known. RF adaptive filters, at their simplest, permit selection of bandwidth by insertion or deletion of switchable capacitors, resulting in discrete choices of filter bandwidth. Non-discrete selection of bandwidth could be achieved using varactor diodes. However, filter selectivity for maximum rejection of co-channel interference is best achieved with a surface acoustic wave filter or with a crystal filter, both of which possess fixed bandwidths.

In the past, adaptive analog filters have been either parallel banks of bandpass filters with user-selectable finite filter bandwidth or electronically tuned filters with variable bandwidths controlled by an analog control voltage. One problem of the latter has been maintaining a steep filter skirt or high selectivity with changes in control voltage. Another problem has been compensating for receiver center frequency of the adaptive filter due to transmitter center frequency drift.

Adaptive filters have traditionally been used for digital applications at low frequencies. Digital sampling and channelization requirements have limited the use of adaptive filters in this context to audio and video applications. In addition, some digital applications require non-real time processing due to computational requirements of auto-correlation and cross-correlation matrices.

Therefore, an object of the invention is to meet the need to filter wideband jamming signals or offset narrowband co-channel commercial interference.

A further object of the invention is to use the presence of an audio pilot tone multiplexed within the baseband modulation spectrum as a discriminant which controls and determines the amount of bandwidth adaption.

Other objects, advantages and novel features of the invention will become apparent from the following detailed description of the invention when considered in conjunction with the accompanying drawings wherein:

SUMMARY OF THE INVENTION

The adaptive filter for frequency modulation of the present invention utilizes an audio tone multiplexed into the baseband modulation spectrum as a test tone to control and determine the amount of adaptation of the effective and variable bandwidth of the filter for optimum selectivity and rejection of wideband interference or narrowband offset interference. The multiplexed tone is detected and the filter is adjusted according to the signal-to-noise ratio of the detected tone. A continuous and adaptive decrease or increase in bandwidth is produced to accommodate the actual signal bandwidth to increase rejection of interference with minimum distortion. Additionally, the filter compensates for transmitter drift of center frequency. This filter may be used at radio or intermediate frequencies.

DETAILED DESCRIPTION OF THE INVENTION

Figure 1:
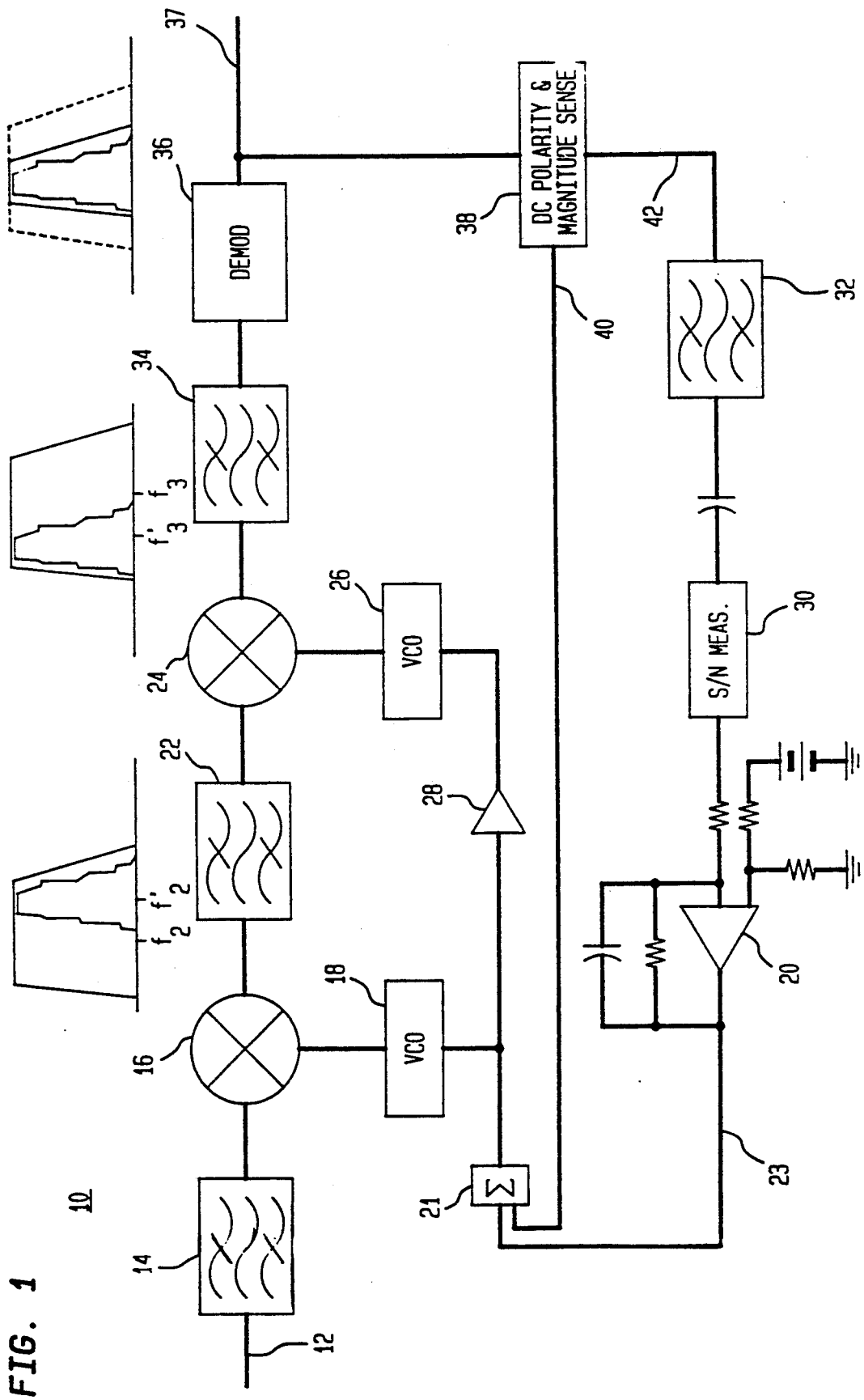
FIG. 1 shows a schematic representation of the adaptive filter circuit of the present invention.

Referring now to FIG. 1, there is shown adaptive filter 10 of the present invention. Adaptive filter 10 automatically adapts its bandwidth to provide suppression of interference when an input signal to be filtered is applied to input terminal 12 of adaptive filter 10. The degree of adaptation of adaptive filter 10, or the bandwidth of adaptive filter 10, is determined by the signal-to-noise ratio of a signal discriminant such as an auto pilot tone, or test tone, which is multiplexed into the baseband modulation waveform of the input signal to filter 10.

Surface acoustic wave or crystal filters 22,34 are selected to provide the desired selectivity of adaptive filter 10. Thus the steepness of filter sides or filter skirts of adaptive filter 10 are determined by the selection of surface acoustic wave or crystal filters 34,22. Filter 14 is a conventional filter, of the type commonly used in conventional receivers. Filters 22,34 can be as simple as a conventional IF filter commonly used in commercial stereo FM radios.

Figure 2:
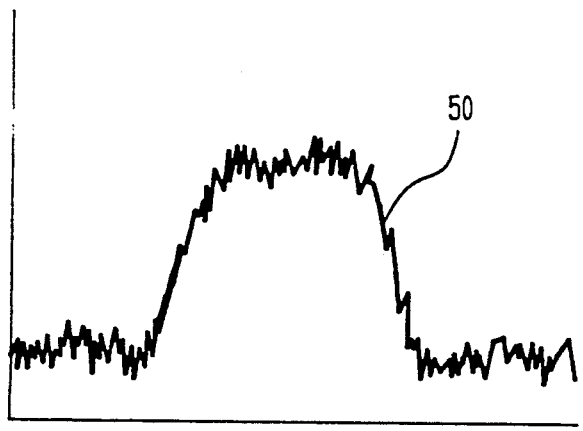
FIG. 2 shows a graphical representation of the response curve of the filter of FIG. 1 when the poles are adjusted for a maximum bandwidth.

Referring now to FIG. 2, there is shown graphical representation 50 of a maximum bandwidth of adaptive filter 10 of the present invention. The ratio of −50 dB bandwidth to −3 dB bandwidth of the curve of graphical representation 50 provides a shape factor of 2.1:1. It will be understood by those skilled in the art that graphical representation 50 is typical of the bandwidth of a device such as adaptive filter 10, but that adaptive filter 10 may have a bandwidth other than those set forth herein. In particular, it will be understood that a lower shape factor enhances the suppression of the interference in adaptive filter 10. Graphical representation 50 is provided by applying white noise to input terminal 12 of adaptive filter 10.

Figure 3:
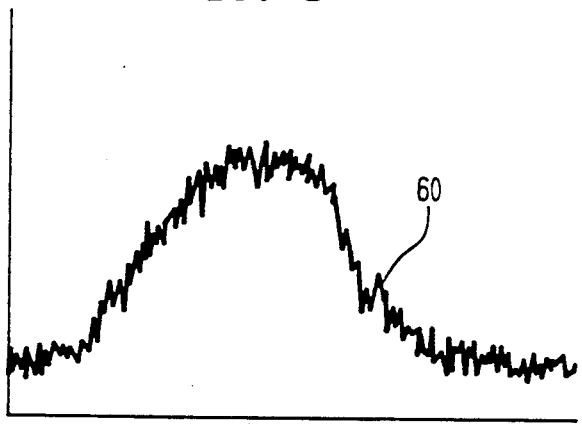
FIG. 3 shows a graphical representation of the response curve of the filter of FIG. 1 when the poles are adjusted for more narrow bandwidth.

Referring now to FIG. 3, there is shown graphical representation 60. Graphical representation 60 is provided by off-setting voltage controlled oscillators 18, 26 from the setting of graphical representation 50. This results in a narrower −3 dB filter bandwidth in the response curve of adaptive filter 10.

Figure 4:
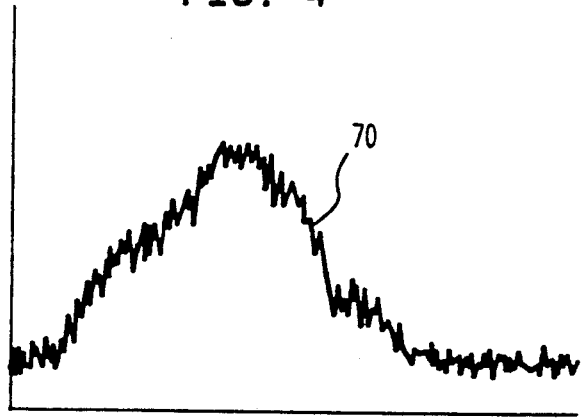
FIG. 4 shows a graphical representation of the response curve of the filter of FIG. 1 when the poles are adjusted for a minimum bandwidth.

Referring now to FIG. 4, there is shown graphical representation 70. Graphical representation 70 represents a narrow filter bandwidth which is obtained with another resetting of voltage controlled oscillators 18, 26 of adaptive filter 10. Note that the shape factor of the curve of graphical representation 70 is increased in comparison with graphical representation 50 and graphical representation 70. If surface acoustic wave filters with steep skirts are selected, then this effect is minimized.

Figure 5:
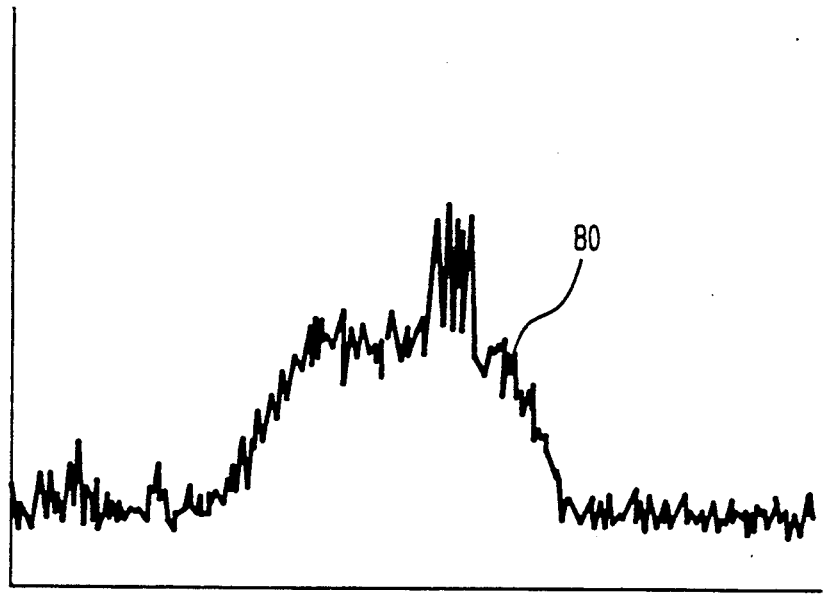
FIG. 5 shows a graphical representation of the frequency response of the filter of FIG. 1 wherein interference is suppressed on one side due to tuning of a voltage controlled oscillator.
Figure 6:
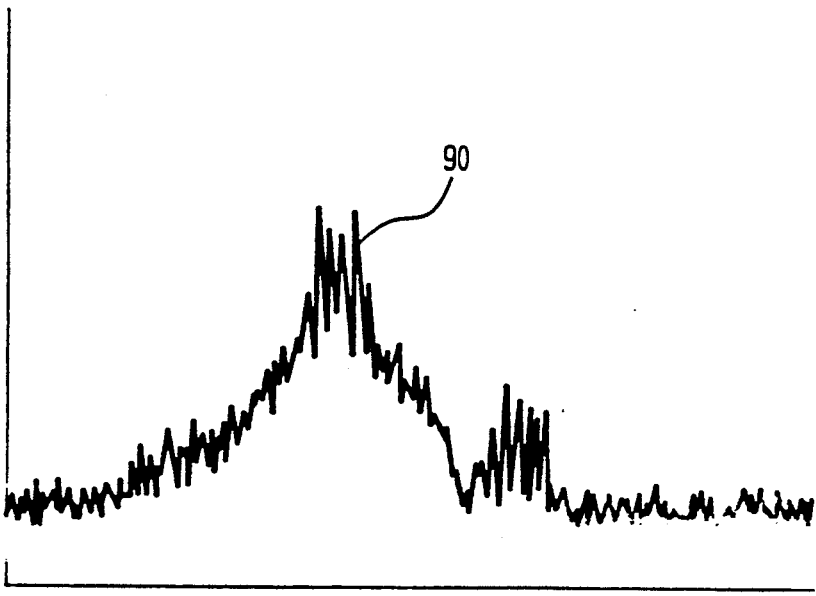
FIG. 6 shows a graphical representation of the frequency response of the circuit of FIG. 1 wherein complete suppression is achieved by the tuning of a voltage controlled oscillator.

Referring now to FIGS. 5, 6, there are shown graphical representations 80, 90. Graphical representations 80, 90 illustrate the operation of adaptive filter 10 when both signal and interference are applied to adaptive filter 10. In this case, white noise is the selected interference. The desired signal is a frequency modulated signal with a deviation of a +/−40 kHz and a modulation index of 40:1.

Graphical representation 80 shows the effect of tuning voltage controlled oscillator 18 to a position near the right hand skirt of adaptive filter 1 0, thereby attenuating the interference on the right hand side of the filter 10 response. Next, the signal is tuned via voltage controlled oscillator 26 to the left edge of the response curve of the adaptive filter 10. Tuning adaptive filter 10 using voltage controlled oscillator 26 attenuates the interference of the left edge of the responsive curve of adaptive filter 10 response. The composite signal is filtered with minimum bandwidth filter.

The interference suppression for broadband barrage-type interference is approximately proportional to the ratio of the wide open bandwidth of adaptive filter 10 to the final, narrow bandwidth of adaptive filter 10. The suppression, therefore, depends on the modulation index of the desired input signal as well as the type of interference. Adaptive filter 10 works most favorably for low deviation signals and offset narrowband interference. These types of signals and interference are commonly found in many applications. Note that a spurious product is apparent but is 30 dB down from the main signal.

During operation of adaptive filter 10, RF or IF frequency is applied to input terminal 12. The response of input filter 14 is fairly wide compared to the desired signal's bandwidth and is centered at the channel center and input filter 14 rejects all course wideband interference outside of the designated channel bandwidth. The output signal of input filter 14 is translated or mixed to a distant frequency by frequency mixer 16. This distant frequency is $f_2'$ and is controlled by the variable voltage which tunes the frequency of local voltage controlled oscillator 18. The variable voltage which tunes local voltage controlled oscillator 18 is adjusted in conjunction with local voltage controlled oscillator 26 until signal quality is acceptable. Surface acoustical wave filter 22 has high selectivity and the center frequency $f_2$, where $f_2$ is less than $f_2'$. The effect of this signal translation and filtering operation is rejection of co-channel interference with frequency content higher than $f_2$+delta, where delta is the highest frequency component of the desired signal.

Frequency mixer 24 produces the opposite effect of frequency mixer 16. Frequency mixer 24 translates the signal received from surface acoustic wave filter 24 to another distant frequency $f'_3$, where $f'_3$ is less than $f_3$. This translation by frequency mixer 24 takes advantage of the selectivity of filter 34 on the lower frequency side of filter 34, thereby attenuating interference components less than $f_3$—delta.

The signal at the output of surface acoustic wave filter 34 is then demodulated by demodulator 36. If the desired measure of signal quality is not achieved at the output of the demodulator 36, DC polarity and magnitude sensor 38 detects the DC content of the demodulator 36 output signal as well as the polarity of the DC content. DC polarity and magnitude sensor 38 then fine tunes or offsets voltage-controlled oscillators 18, 26 accordingly by way of control line 40. This fine tuning in accordance with DC content may be used to compensate for transmitter center frequency drift.

Output line 42 of DC voltage polarity and magnitude sensor 38 is applied to pilot tone filter 32 or bandpass filter 32 and the signal at the output of the demodulator 36 is filtered to select the pilot tone or test tone which is multiplexed into the baseband modulation of the input signal applied to input terminal 12 of adaptive filter 10. The pilot tone output of bandpass 32 is AC-coupled to signal quality measurement device 30. Signal quality measurement device 30 may be, for example, a device for measuring the signal-to-noise ratio of the pilot tone signal or test tone provided by pilot tone filter 32.

When the desired signal quality is reached, the output of tone decoder 30 or signal-to-noise measurement device 30 toggles from ground potential to a high level which, in a steady state, causes integrator 20 to apply a quiescent level to voltage controlled oscillators 18, 26. Integrator 20 is a conventional op-amp integrator circuit. The voltage-to-frequency transfer curves of voltage controlled oscillators 18, 26 are effectively oppositely polarized. Voltage controlled oscillator 18 outputs increasing frequency with increasing voltage input from the output of integrator 20. Voltage controlled oscillator 26 outputs decreasing frequency with increasing voltage input from the output of integrator 20. Invertor and level shifter 28 serves to achieve the desired transfer curve polarity for voltage controlled oscillator 26. Summer 21 sums the output of DC polarity and magnitude sensor 38, applied by way of line 40, and the output of integrator 20, applied by way of line 23, for controlling the voltage levels applied to voltage controlled oscillators 18, 26.

Under steady state conditions, the demodulated output at output terminal 37 of adaptive filter 10 achieves the desired measure of signal quality and, consequently, a level of antijam is achieved with respect to certain types of interfering signals. Adaptive filter 10 may be inserted into existing receiver designs if the frequencies of voltage controlled oscillators 18, 26 and surface acoustic wave filters 22,34 are center frequencies and bandwidths which are selected according to the required parameters of the receiver.

When adaptive filter 10 is initially turned on, and occasionally after adaptive filter 10 is in normal operation for a period of time, the output of integrator 20 must rise to a particular integration level. For example, when adaptive filter 10 is turned on the reference voltage of integrator 20 is initially larger than the voltage on the inverting terminal of integrator 20 because the output of device 30 measuring signal quality, for example, pilot tone decoder, does not meet the prescribed threshold. Voltage controlled oscillators 18, 26 are designed to translate the desired IF or RF signal to filters 22,24, respectively, under this condition. Therefore, when adaptive filter 10 is initially turned on and the feedback loop has not yet achieved the desired measure of signal quality at the output of demodulator 36, adaptive filter 10 ramps up to, or translates the desired signal toward, the bank edges of filters 22 & 34, consequently reducing the level of interferences.

An advantage of this technique over traditional adaptive filters is reduced design time. Design time is reduced because a complex electronically-tuned filter need not be designed, only selective filters need be chosen. In this method, rejection of interference is based on a desired and quantifiable measure of signal quality, for example the demodulated signal-to-noise ratio of a signal discriminant, an audio pilot tone in the modulation format.

Adaptive filter 10 therefore provides an analog circuit with feedback which effectively produces an adaptive filter which filters offset narrowband, co-channel interference or wideband, barrage-type noise. As previously described, the input signal of adaptive filter 10 must have a pilot tone such as an audio FM tone frequency modulated onto the carrier to serve as a measure of signal quality.

Many modifications and variations of the present invention are possible in view of the above disclosure. It is, therefore, to be understood that within the scope of the appended claims, the invention may be practiced otherwise than as specifically described.

I claim:

1. A method for adaptably filtering an input signal having a baseband modulation process, comprising the steps of:
   (a) providing a test signal within said baseband modulation spectrum of said input signal;
   (b) filtering said input signal by means of a first filter having a first filter pole to provide a first filtered signal;
   (c) first detecting said test signal within said first filtered signal and determining a signal-to-noise ratio in response to detecting said test signal; and
   (d) adjusting said first filter pole in accordance with said signal-to-noise ratio of said detected test signal.

2. The method for adaptively filtering an input signal of claim 1, wherein step (d) comprises the steps of:
   (e) providing a filter pole adjust signal in accordance with said signal-to-noise ratio; and
   (f) adjusting said first filter pole in accordance with said filter pole adjust signal.

3. The method for adaptively filtering an input signal claim 1, wherein step (c) is preceded by the further step of demodulating said first filtered signal to provide a first demodulated signal.

4. The method for filtering an input signal of claim 3, wherein step (c) comprises detecting said test signal within said first demodulated signal.

5. The method for filtering an input signal of claim 1, comprising the further steps of:
   (g) filtering said first filtered signal by means of a second filter having a second filter pole to provide a second filtered signal;
   (h) detecting said test signal within said second filtered signal and providing a first detection signal in response to detecting said test signal; and,
   (i) adjusting said second filter pole in accordance with the second detection signal.

6. The method for adaptively filtering an input signal of claim 1, comprising the further step of detecting a voltage level within said first filtered signal and providing a voltage level detection signal in accordance with said voltage level.

7. The method for adaptively filtering an input signal of claim 7, comprising the further step of adjusting said first pole in accordance with said voltage level detection signal.

8. The method for adaptively filtering an input signal of claim 1, comprising the further step of integrating said signal-to-noise ratio to provide an integrated first detection signal.

9. The method for adaptively filtering an input signal of claim 8, comprising the further step of adjusting said first filter pole in accordance with said integrated first detection signal.

10. An adaptive filter for adaptively filtering an input signal having a baseband modulation spectrum, comprising:
    means for providing a test signal within said baseband modulation spectrum of said input signal;
    first filter means for filtering said signal, said first filter means having a first filter pole to provide a first filtered signal;
    first detecting means for detecting said test signal within said first filtered signal and determining a signal-to-noise ratio in response to detecting said test signal; and,
    means for adjusting said first filter pole in accordance with the signal-to-noise ratio of said detected test.

11. The adaptive filter for adaptively filtering an input signal of claim 10, wherein said adjusting means comprises:
    means for providing a filter pole adjust signal in accordance with said signal-to-noise ratio; and
    means for adjusting said first filter pole in accordance with said filter pole adjust signal.

12. The adaptive filter for adaptively filtering an input signal claim 10, wherein further comprising means for demodulating said first filtered signal to provide a first demodulated signal.

13. The adaptive filter for adaptively filtering an input signal of claim 12, further comprising means for applying said demodulated signal to said first detecting means.

14. The adaptive filter for filtering an input signal of claim 12, wherein said first detecting means comprises means for detecting said test signal within said first demodulated signal.

15. The adaptive filter for filtering an input signal of claim 10, further comprising:
    second filtering means for filtering said first filtered signal, said second filtering means having a second filter pole to provide a second filtered signal;
    means for detecting said test signal within said second filtered signal and providing a second detection signal; and,
    means for adjusting said second filter pole in accordance with the second detection signal.

16. The adaptive filter for adaptively filtering an input signal of claim 10, wherein said test signal comprises an audio signal.

17. The adaptive filter for adaptively filtering an input signal of claim 10, further comprising means for detecting a voltage level within said second filtered signal and adjusting said first filter pole in accordance with said detected voltage level.

18. The adaptive filter for adaptively filtering an input signal of claim 10, further comprising means for integrating said second detection signal to provide an integrated second detection signal and adjusting said second filter pole in accordance with said integrated second detection signal.

19. A method for adaptively filtering an input signal having a baseband modulation spectrum, comprising the steps of:
    (a) providing a test signal within said baseband modulation spectrum of said input signal;
    (b) filtering said input signal by means of a filter having a filter pole to provide a filtered signal;
    (c) demodulating said filtered signal to provide a demodulated signal; and,
    (d) detecting said test signal and providing a detection signal in response to said demodulated signal.

20. A method for adaptively filtering an input signal having a baseband modulation spectrum, comprising the steps of:
    (a) providing a voltage level signal within said baseband modulation spectrum of said input signal;
    (b) filtering said input signal by means of a first filter having a filter pole to provide a filtered signal;
    (c) detecting said voltage level signal within said filtered signal and providing a voltage level detection signal in accordance with said voltage level; and,
    (d) adjusting said filter pole in accordance with said voltage level detection signal.

21. A method for adaptively filtering an input signal having a baseband modulation spectrum, comprising the steps of:
    (a) providing a test signal within said baseband modulation spectrum of said input signal;
    (b) filtering said input signal by means of a filter having a filter pole to provide a filtered signal;
    (c) detecting said test signal within said filtered signal and providing a detection signal in response to detecting said test signal;
    (d) integrating said detection signal to provide an integrated detection signal; and,
    (e) adjusting said filter pole in accordance with said integrated detection signal.

* * * * *